United States Patent
Kondo et al.

(10) Patent No.: US 12,193,335 B2
(45) Date of Patent: Jan. 7, 2025

(54) TEMPERATURE STABILIZED OSCILLATOR

(71) Applicant: SEIKO EPSON CORPORATION, Tokyo (JP)

(72) Inventors: Manabu Kondo, Matsumoto (JP); Norihito Matsukawa, Shimosuwa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 764 days.

(21) Appl. No.: 17/407,771

(22) Filed: Aug. 20, 2021

(65) Prior Publication Data

US 2022/0059752 A1   Feb. 24, 2022

(30) Foreign Application Priority Data

Aug. 24, 2020   (JP) .................. 2020-140706
Aug. 24, 2020   (JP) .................. 2020-140707

(51) Int. Cl.
  *H10N 30/88*   (2023.01)
  *H03B 5/32*   (2006.01)
  *H10N 30/80*   (2023.01)

(52) U.S. Cl.
  CPC ............. *H10N 30/883* (2023.02); *H03B 5/32* (2013.01); *H10N 30/802* (2023.02)

(58) Field of Classification Search
  CPC ...... H10N 30/883; H10N 30/802; H03B 5/32; H03H 9/0552; H03H 9/0509; H03H 9/0547; H03H 9/1021; H03H 9/08
  See application file for complete search history.

(56) References Cited

U.S. PATENT DOCUMENTS

| | | | |
|---|---|---|---|
| 6,731,180 B1 | 5/2004 | Clark et al. | |
| 2014/0292422 A1 | 10/2014 | Kondo | |
| 2017/0359075 A1 | 12/2017 | Kikuchi | |
| 2017/0373693 A1 | 12/2017 | Kondo | |
| 2018/0278209 A1 | 9/2018 | Obata et al. | |
| 2018/0342981 A1* | 11/2018 | Kondo | H03H 9/1014 |
| 2020/0021294 A1 | 1/2020 | Hamaguchi et al. | |

FOREIGN PATENT DOCUMENTS

| | | |
|---|---|---|
| JP | 2011-61577 A | 3/2011 |
| JP | 2014-197730 A | 10/2014 |
| JP | 2017-130861 | 7/2017 |
| JP | 2017-220887 A | 12/2017 |
| JP | 2018-6808 A | 1/2018 |
| JP | 2018-160892 | 10/2018 |
| JP | 2020-14055 A | 1/2020 |

* cited by examiner

*Primary Examiner* — Emily P Pham
(74) *Attorney, Agent, or Firm* — Rankin, Hill & Clark LLP

(57) ABSTRACT

An oscillator includes a second container as a container in which a vibrator is accommodated, a base substrate on which the second container is mounted, three or more protruding portions provided on the base substrate at positions overlapping the second container in a plan view, and a bonding member configured to bond the second container and at least one of the protruding portions.

10 Claims, 11 Drawing Sheets

TEMPERATURE STABILIZED OSCILLATOR

The present application is based on, and claims priority from JP Applications Serial Number 2020-140706, filed Aug. 24, 2020 and 2020-140707, filed on August 24, the disclosure of which is hereby incorporated by reference herein in its entirety.

BACKGROUND

1. Technical Field

The present disclosure relates to an oscillator.

2. Related Art

A temperature compensated oscillator includes a resonator element, and an integrated circuit including an oscillation circuit for oscillating the resonator element and a temperature compensation circuit. When the integrated circuit performs temperature compensation on a deviation of an oscillation frequency of the resonator element from a desired frequency in a predetermined temperature range, high frequency accuracy can be obtained. As such a temperature compensated oscillator, for example, JP-A-2018-160892 discloses a temperature compensated oscillator in which a first container in which a resonator element is accommodated and an integrated circuit are stacked and accommodated in a second container to reduce a temperature difference between the resonator element and the integrated circuit and to obtain higher frequency accuracy.

However, in the temperature compensated oscillator described in JP-A-2018-160892, in order to reduce the temperature difference between the resonator element and the integrated circuit, the integrated circuit is stacked on a base of the first container accommodating the resonator element, and an entire surface of a lid of the first container is fixed to a bottom surface of a recessed portion of a base of the second container. Therefore, heat transfer between the first container and the base of the second container may be increased, the oscillator may be easily affected by an external temperature change via the base of the second container, and frequency stability of an output oscillation frequency may be deteriorated.

SUMMARY

An oscillator includes a container in which a vibrator is accommodated, a base substrate on which the container is mounted, three or more protruding portions provided on the base substrate at positions overlapping the container in a plan view, and a bonding member configured to bond the container and at least one of the protruding portions.

DESCRIPTION OF EXEMPLARY EMBODIMENTS

1. First Embodiment

First, an oscillator 1 according to a first embodiment will be described with reference to FIGS. 1, 2, and 3 by taking a temperature compensated oscillator having a double seal structure as an example.

Figure 1:
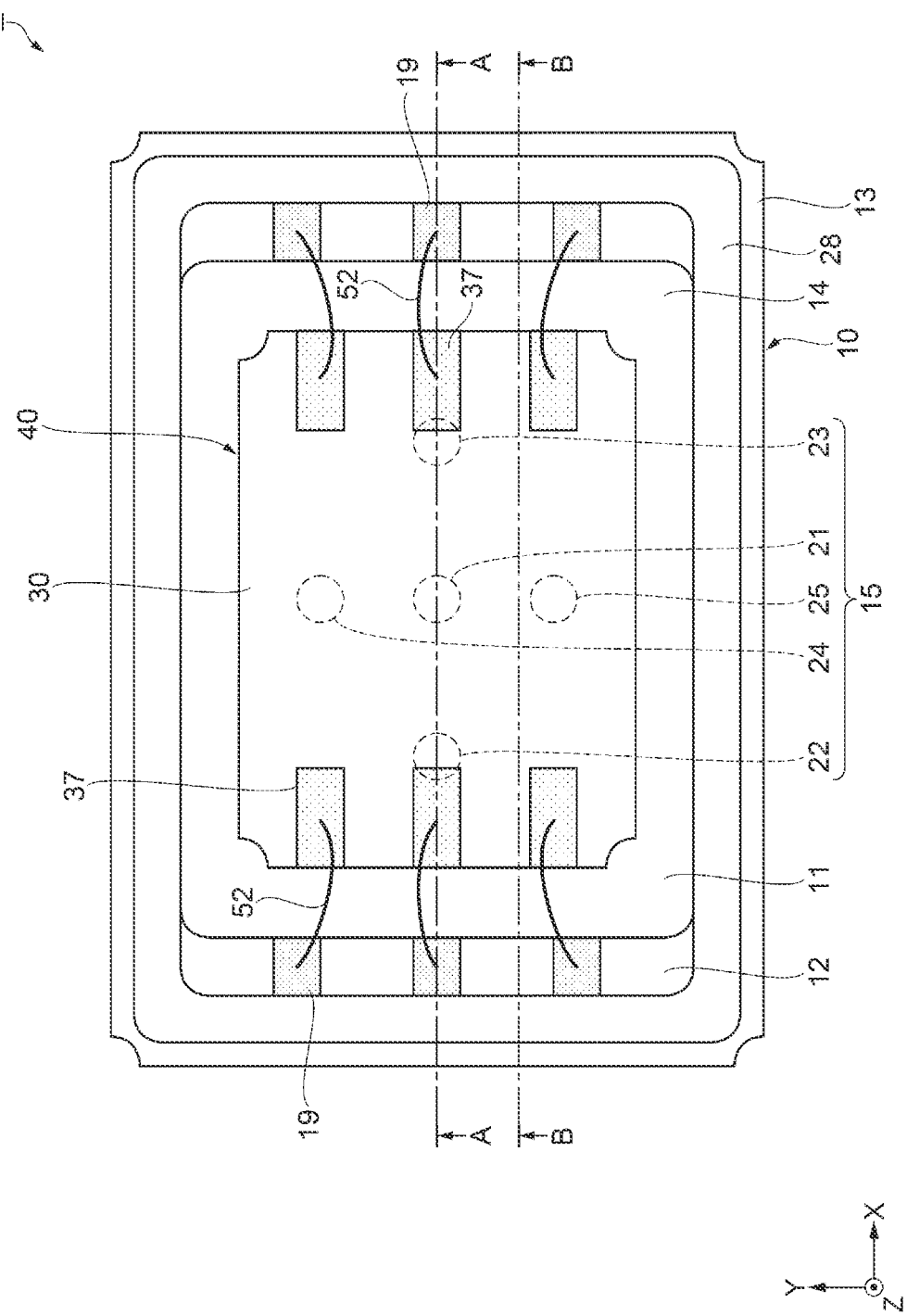
FIG. 1 is a plan view showing a schematic structure of an oscillator according to a first embodiment.

For convenience of description of an internal configuration of the oscillator 1, FIG. 1 shows a state in which a first lid 27 is removed. Further, in FIGS. 1, 2, and 3, wirings which electrically couple internal terminals 19 to external terminals 20 which are provided at a first container 5, and terminals and wirings provided in a second container 30 are not shown.

For convenience of the description, in the following drawings, an X axis, a Y axis, and a Z axis are shown as three axes orthogonal to each other. A direction along the X axis is referred to as an "X direction", a direction along the Y axis is referred to as a "Y direction", and a direction along the Z axis is referred to as a "Z direction". Further, an arrow tip end side in each axial direction is also referred to as a "plus side", a base end side is also referred to as a "minus side", a plus side in the Z direction is referred to as "upper", and a minus side in the Z direction is referred to as "lower".

Figure 2:
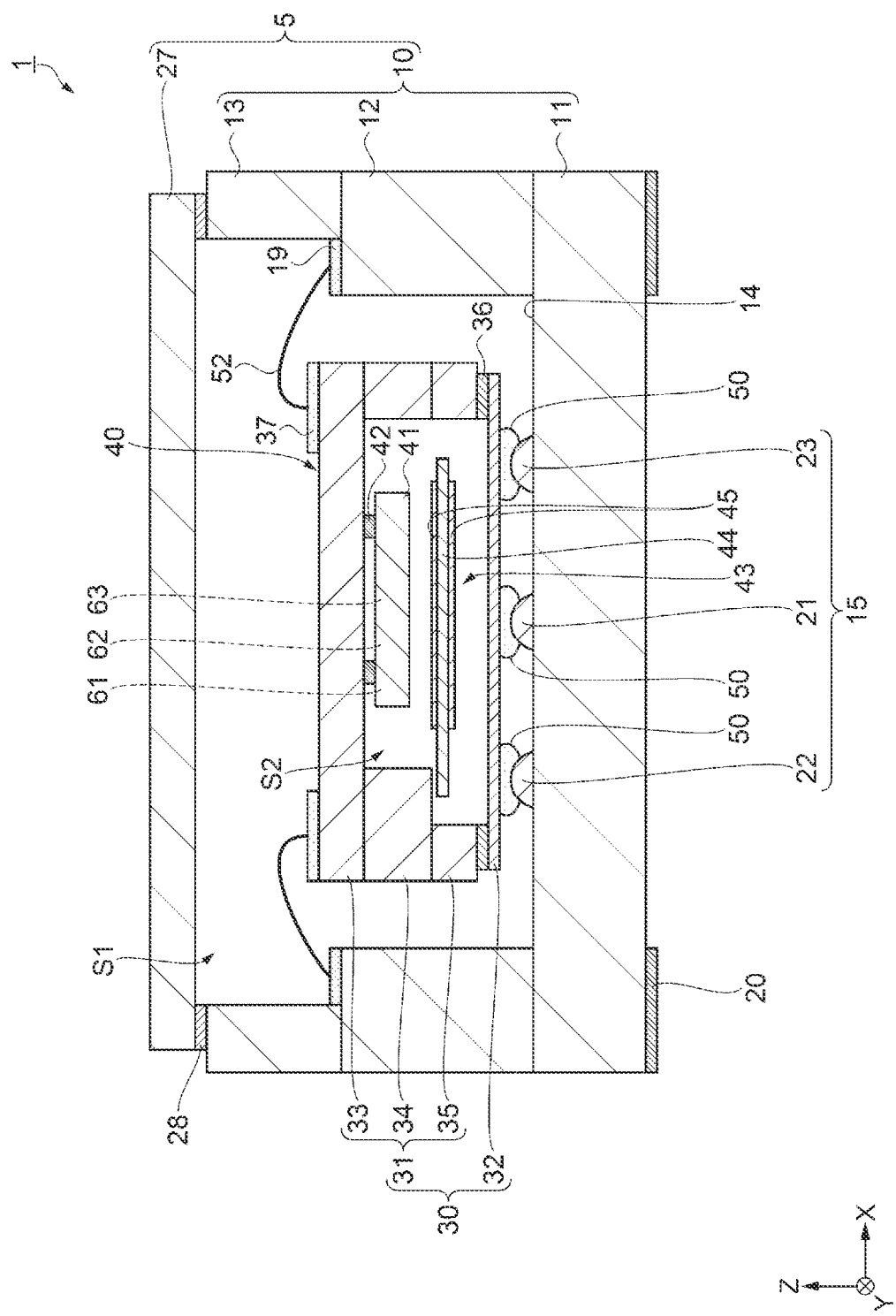
FIG. 2 is a cross-sectional view taken along a line A-A in FIG. 1.
Figure 3:
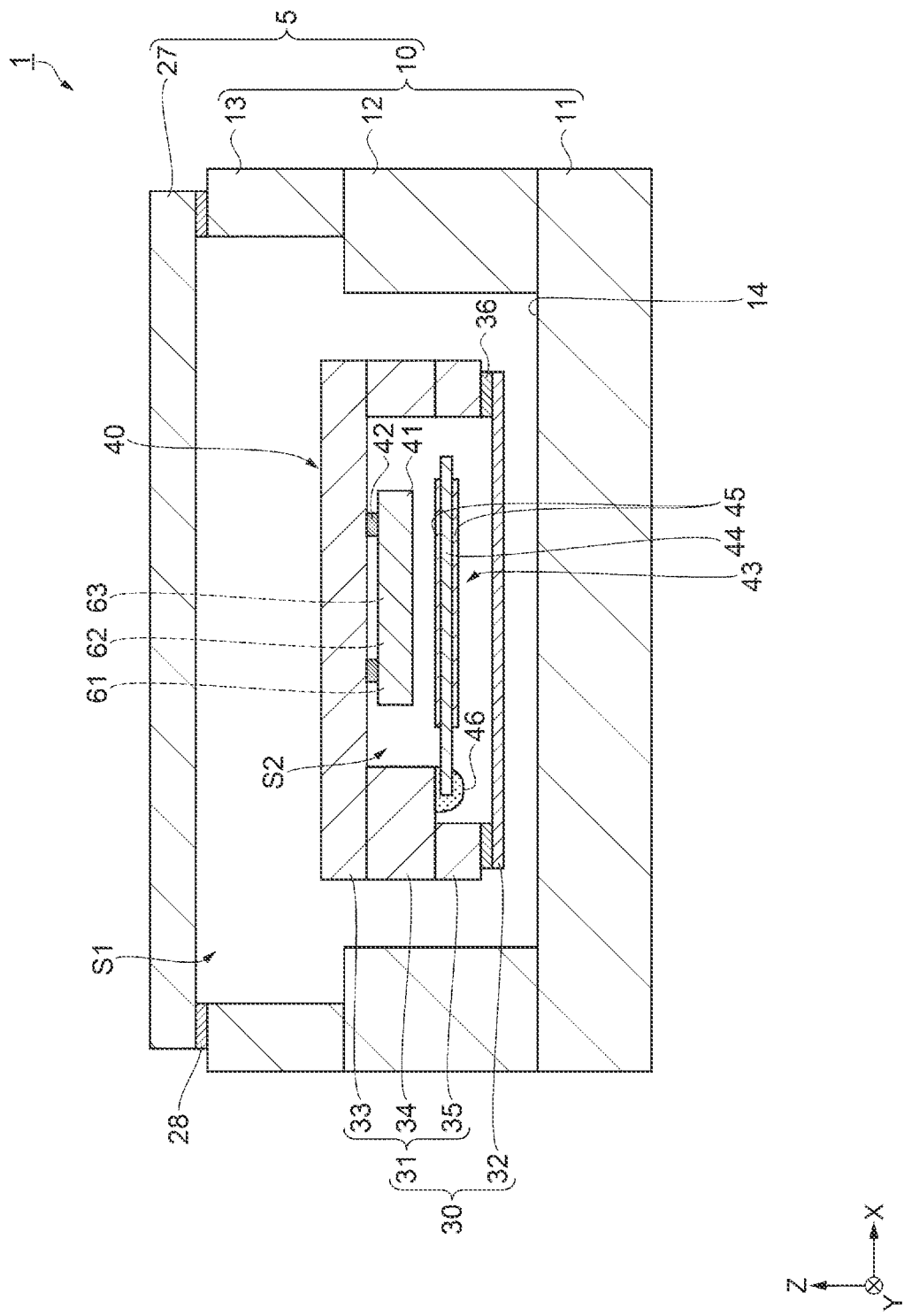
FIG. 3 is a cross-sectional view taken along a line B-B in FIG. 1.

As shown in FIGS. 1, 2, and 3, the oscillator 1 according to the present embodiment includes a temperature compensated oscillator 40 in which an integrated circuit 41 and a vibrator 43 are accommodated in the second container 30 as a container, and the first container 5 in which the temperature compensated oscillator 40 is accommodated.

The temperature compensated oscillator 40 includes the integrated circuit 41, the vibrator 43, and the second container 30 in which the vibrator 43 and the integrated circuit 41 are accommodated.

The second container 30 includes a second base 31 as a base made of ceramic and the like and a second lid 32 as a lid made of metal, ceramic, glass, and the like. The second base 31 and the second lid 32 are bonded to each other via a bonding member 36 such as a seal ring and a low melting point glass.

As shown in FIGS. 2 and 3, the second base 31 is formed by stacking a flat plate-shaped first substrate 33, an annular second substrate 34 from which a central portion is removed, and a third substrate 35 having an annular opening larger than the second substrate 34. A plurality of terminals 37 are provided at a surface of the first substrate 33 on a side opposite to the second substrate 34. An accommodation space S2 for accommodating the vibrator 43 and the integrated circuit 41 is formed inside the second base 31 by the annular second substrate 34 and the third substrate 35. The accommodation space S2 is an airtight space in which inert gas such as nitrogen, helium, and argon is enclosed. However, an atmosphere of the accommodation space S2 is not particularly limited, and may be, for example, a depressurized state or a pressurized state.

As shown in FIG. 2, the integrated circuit 41 is fixed to a surface of the first substrate 33 on an accommodation space S2 side via a conductive bonding member 42 such as a metal bump and solder. Further, as shown in FIG. 3, the vibrator 43 is fixed to a surface of a portion of the second substrate 34 that does not overlap the third substrate 35 via a conductive bonding member 46 such as a conductive adhesive.

The integrated circuit 41 is electrically coupled to the terminals 37 via a wiring (not shown) and a through electrode (not shown) which are provided at the surface of the first substrate 33 on the accommodation space S2 side. Further, the vibrator 43 is electrically coupled to the integrated circuit 41 via a terminal (not shown) and a through electrode (not shown) which are provided at the surface of the portion of the second substrate 34 that does not overlap the third substrate 35.

The integrated circuit 41 includes an oscillation circuit 61 which is accommodated in the accommodation space S2 of the second container 30 and oscillates the vibrator 43, a temperature compensation circuit 62 which performs temperature compensation on a deviation of an oscillation frequency of the vibrator 43 from a desired frequency in a predetermined temperature range, and a temperature sensor 63 which detects a temperature in the accommodation space S2.

The vibrator 43 includes a flat plate-shaped substrate 44 and excitation electrodes 45 provided at two surfaces which serves as front and rear surfaces of the substrate 44. The vibrator 43 has a cantilever structure in which one end portion in the X direction is fixed to the second container 30 by the bonding member 46. The excitation electrodes 45 are electrically coupled to the integrated circuit 41 via lead electrodes (not shown) provided at the two surfaces and the conductive bonding member 46. The vibrator 43 oscillates at a frequency corresponding to a mass of the substrate 44 including the excitation electrodes 45. As the vibrator 43, for example, a crystal vibrator, a surface acoustic wave (SAW) resonator, other piezoelectric vibrators, a micro electro mechanical systems (MEMS) vibrator, and the like can be used. As a material of the substrate 44, a piezoelectric material such as piezoelectric single crystal such as crystal, lithium tantalate, and lithium niobate, piezoelectric ceramic such as lead zirconate titanate, or a silicon semiconductor material can be used.

The first container 5 includes a first base 10 made of the ceramic and the like and the first lid 27 made of the metal, the ceramic, the glass, and the like. The first base 10 and the first lid 27 are bonded to each other via a sealing member 28 such as the seal ring and the low melting point glass.

As shown in FIGS. 2 and 3, the first base 10 is formed by stacking a flat plate-shaped base substrate 11, an annular second substrate 12 from which a central portion is removed, and a third substrate 13 having an annular opening larger than the second substrate 12. As shown in FIG. 1, the plurality of internal terminals 19 are provided at a surface of a portion of the second substrate 12 that does not overlap the third substrate 13. Further, the plurality of external terminals 20 are provided at a surface of the base substrate 11 on a side opposite to the second substrate 12. The internal terminals 19 and the external terminals 20 are electrically coupled to each other via a through electrode (not shown). An accommodation space S1 for accommodating the temperature compensated oscillator 40 is formed inside the first base 10 by the annular second substrate 12 and the third substrate 13.

The accommodation space S1 is an airtight space in which the inert gas such as nitrogen, helium, and argon is enclosed. However, an atmosphere of the accommodation space S1 is not particularly limited, and may be, for example, the depressurized state or the pressurized state.

The base substrate 11 extends in the X direction and the Y direction, and has a thickness in the Z direction. On an upper surface 14 of the base substrate 11 facing the temperature compensated oscillator 40, a plurality of protruding portions 15 formed by insulating bump members such as an epoxy resin, a polyimide resin, and a silicon resin are provided at positions of the temperature compensated oscillator 40 overlapping the second container 30, that is, at positions inside an outer periphery of the second container 30 in a plan view from the Z direction.

The protruding portions 15 can be formed by applying an adhesive such as the epoxy resin, the polyimide resin, and the silicon resin in a paste form as the bump member onto the upper surface 14 of the base substrate 11 in a hemispherical shape by a dispenser, and then curing the adhesive by heating. By making a discharge amount from the dispenser constant, diameters and heights of the protruding portions 15 can be made uniform. Therefore, the second container 30 can be fixed in parallel along the upper surface 14 of the base substrate 11.

Each of the protruding portions 15 fixes the temperature compensated oscillator 40 to the base substrate 11 by bonding the second lid 32 of the second container 30 via an insulating bonding member 50 such as the epoxy resin, the polyimide resin, and the silicon resin.

Since areas of the protruding portions 15 for fixing the second container 30, more precisely, areas of the bonding members 50 for bonding the second container 30 and the protruding portions 15 are smaller than an area of the second container 30, and the second container 30 and the protruding portions 15 are fixed by the bonding members 50 having a small thermal conductivity, heat transfer between the second container 30 and the base substrate 11 can be reduced as compared to a case where the second container 30 is fixed to the base substrate 11 by the area of the second container 30. Further, in the present embodiment, each of the protruding portions 15 is provided at a position not overlapping the sealing member 28. Therefore, a path of heat conduction from the protruding portion 15 to the vibrator 43 via the sealing member 28 can be lengthened, and a temperature of the vibrator 43 can be further stabilized.

In the present embodiment, five protruding portions 15 are provided at the upper surface 14 of the base substrate 11. A first protruding portion 21 is disposed substantially at a center of the base substrate 11, a second protruding portion 22 and a third protruding portion 23 are disposed along the X direction with the first protruding portion 21 interposed therebetween, and a fourth protruding portion 24 and a fifth protruding portion 25 are disposed along the Y direction with the first protruding portion 21 interposed therebetween. Therefore, the second container 30 can be fixed substantially parallel to the base substrate 11.

In the present embodiment, the five protruding portions 15 are disposed at the base substrate 11, but the present disclosure is not limited thereto, and three or more protruding portions 15 may be disposed. When there are three protruding portions 15, the second container 30 can be fixed substantially parallel to the base substrate 11 by disposing the three protruding portions 15 in a triangular shape at positions overlapping the second container 30 in a plan view. Further, in the present embodiment, the second container 30 is fixed to all of the five protruding portions 15 via the bonding members 50, but the present disclosure is not limited thereto, and the number of the protruding portions 15 for fixing the second container 30 may be one or more.

In the second container 30 in which the second lid 32 is fixed to the protruding portions 15 of the base substrate 11, the terminals 37 provided at the second base 31 and the internal terminals 19 provided at the first base 10 are electrically coupled to each other via bonding wires 52. Therefore, since the terminals 37 provided at the second base 31 and the external terminals 20 provided at the base substrate 11 are electrically coupled to each other via the bonding wires 52, the internal terminals 19, the through electrode (not shown), and the like, a desired frequency temperature-compensated by the temperature compensated oscillator 40 can be output from the external terminals 20.

In the oscillator 1 according to the present embodiment, since the second container 30 is fixed to the three or more protruding portions 15 provided at the base substrate 11 via the insulating bonding members 50 in the area smaller than the area of the second container 30 in which the vibrator 43 is accommodated, a bonding area between the base substrate and the second container 30 is reduced, and the heat conduction caused by the bonding members 50 is also reduced. Therefore, the heat transfer between the second container 30 and the base substrate 11 is reduced, the second container 30 is less likely to be affected by an external temperature change via the base substrate 11, heat is less likely to be radiated from the second container 30, and deterioration of frequency stability of the output oscillation frequency can be reduced. Further, since the bonding area between the second container 30 and the base substrate 11 is reduced, it is possible to reduce transmission of stress generated by warpage of the base substrate 11 to the second container 30.

2. Second Embodiment

Figure 4:
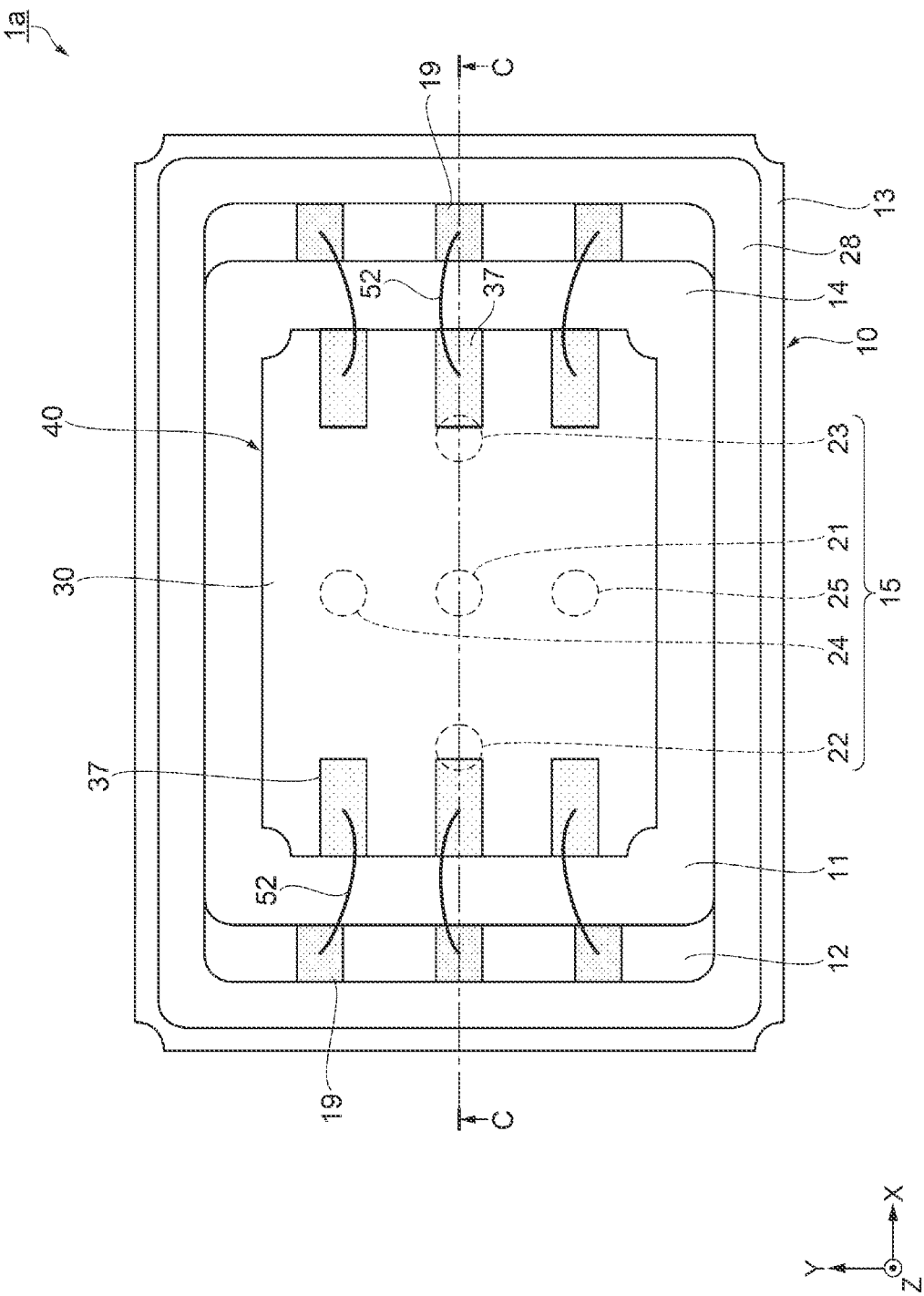
FIG. 4 is a plan view showing a schematic structure of an oscillator according to a second embodiment.

Next, an oscillator 1a according to a second embodiment will be described with reference to FIGS. 4 and 5. FIG. 4 shows a state in which the first lid 27 is removed for convenience of description.

The oscillator 1a according to the present embodiment is similar to the oscillator 1 according to the first embodiment except that the number of the protruding portions 15 fixing the second container 30 is different from that of the oscillator 1 according to the first embodiment. Differences from the first embodiment described above will be mainly described, and the description of the similar matters will be omitted.

Figure 5:
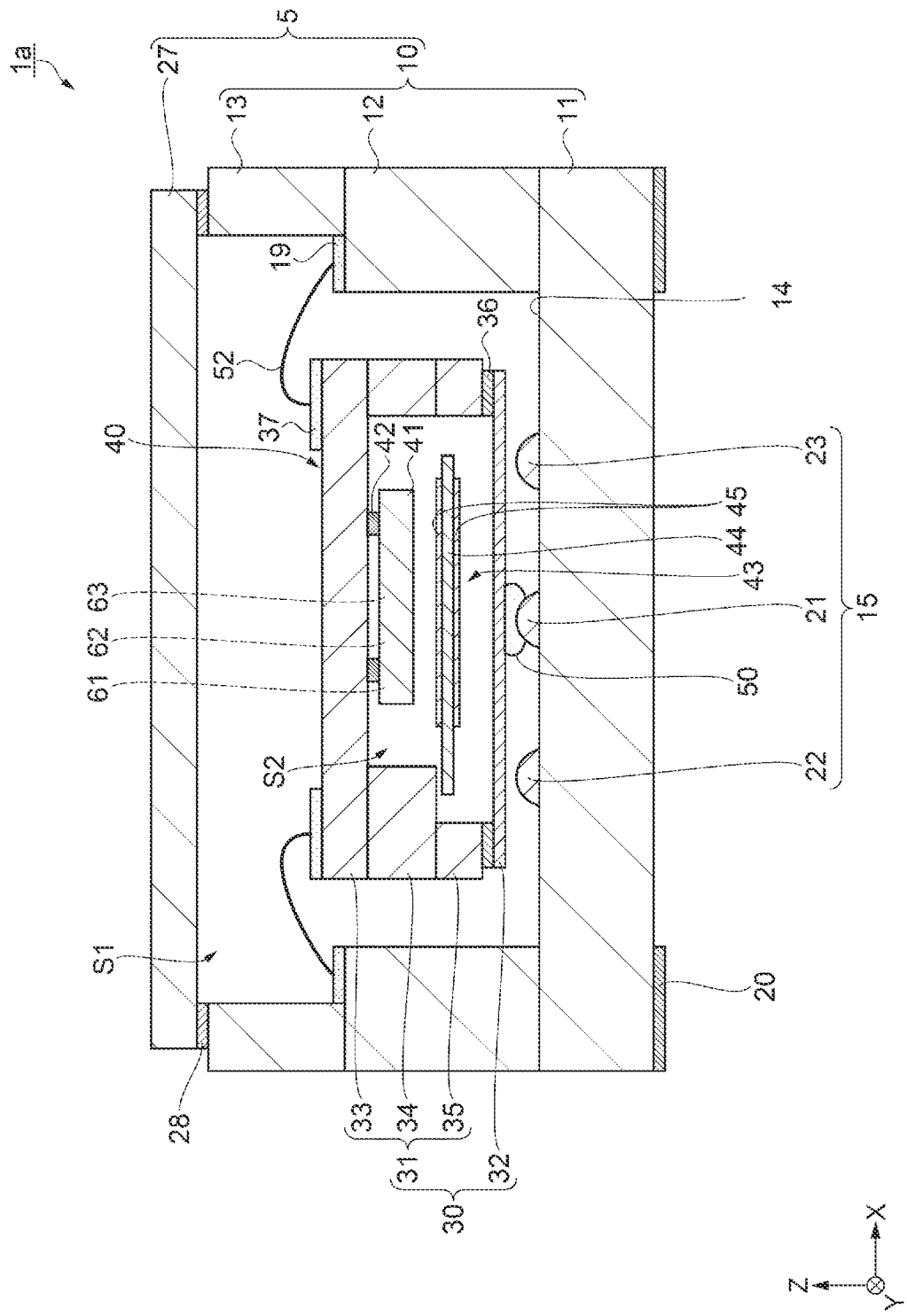
FIG. 5 is a cross-sectional view taken along a line C-C in FIG. 4.

In the oscillator 1a, as shown in FIGS. 4 and 5, five protruding portions 15 are provided at the upper surface 14 of the base substrate 11, and the second container 30 is fixed only to the first protruding portion 21 via the bonding member 50. Further, the second protruding portion 22 and the third protruding portion 23 provided at an outer peripheral side of the second container 30 with respect to the first protruding portion 21 have gaps with the second container 30. Similarly, the fourth protruding portion 24 and the fifth protruding portion 25 provided at the outer peripheral side of the second container 30 with respect to the first protruding portion 21 have the gaps with the second container 30. Since the second container 30 is fixed only by the first protruding portion 21, a bonding area between the second container 30 and the base substrate 11 is further reduced, and heat transfer between the second container 30 and the base substrate 11 can be further reduced. Further, in the present embodiment, at least the first protruding portion 21 is provided at a position not overlapping the sealing member 28. Therefore, a path of heat conduction from the protruding portion 15 to the vibrator 43 via the sealing member 28 can be lengthened, and a temperature of the vibrator 43 can be further stabilized.

Further, since there is a gap between the second container 30 and each of the second protruding portion 22, the third protruding portion 23, the fourth protruding portion 24, and the fifth protruding portion 25, the second container 30 can be fixed in a small area, and when an excessive impact is applied, displacement of the second container 30 can be restricted by the impact by the second protruding portion 22, the third protruding portion 23, the fourth protruding portion 24, and the fifth protruding portion 25 coming into contact with the second container 30.

In the oscillator 1a according to the present embodiment, since the second container 30 is fixed to the base substrate 11 only by the first protruding portion 21, the bonding area between the second container 30 and the base substrate 11 is further reduced, and the heat transfer between the second container 30 and the base substrate 11 can be further reduced.

3. Third Embodiment

Figure 6:
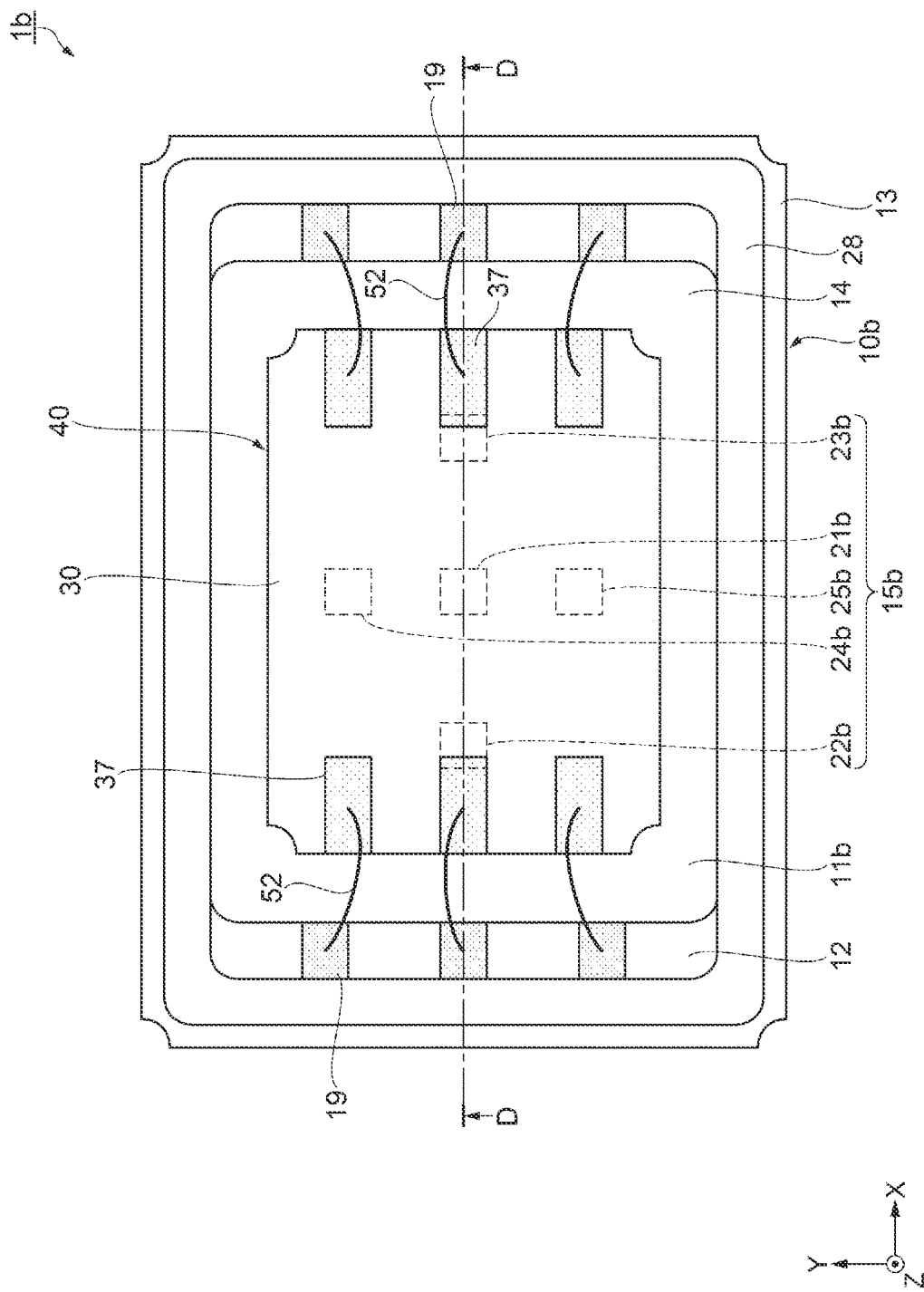
FIG. 6 is a plan view showing a schematic structure of an oscillator according to a third embodiment.

Next, an oscillator 1b according to a third embodiment will be described with reference to FIGS. 6 and 7. FIG. 6 shows a state in which the first lid 27 is removed for convenience of description.

The oscillator 1b according to the present embodiment is similar to the oscillator 1 according to the first embodiment except that a material constituting protruding portions 15b is different from a material of the protruding portions 15 of the oscillator 1 according to the first embodiment. Differences from the first embodiment described above will be mainly described, and the description of the similar matters will be omitted.

Figure 7:
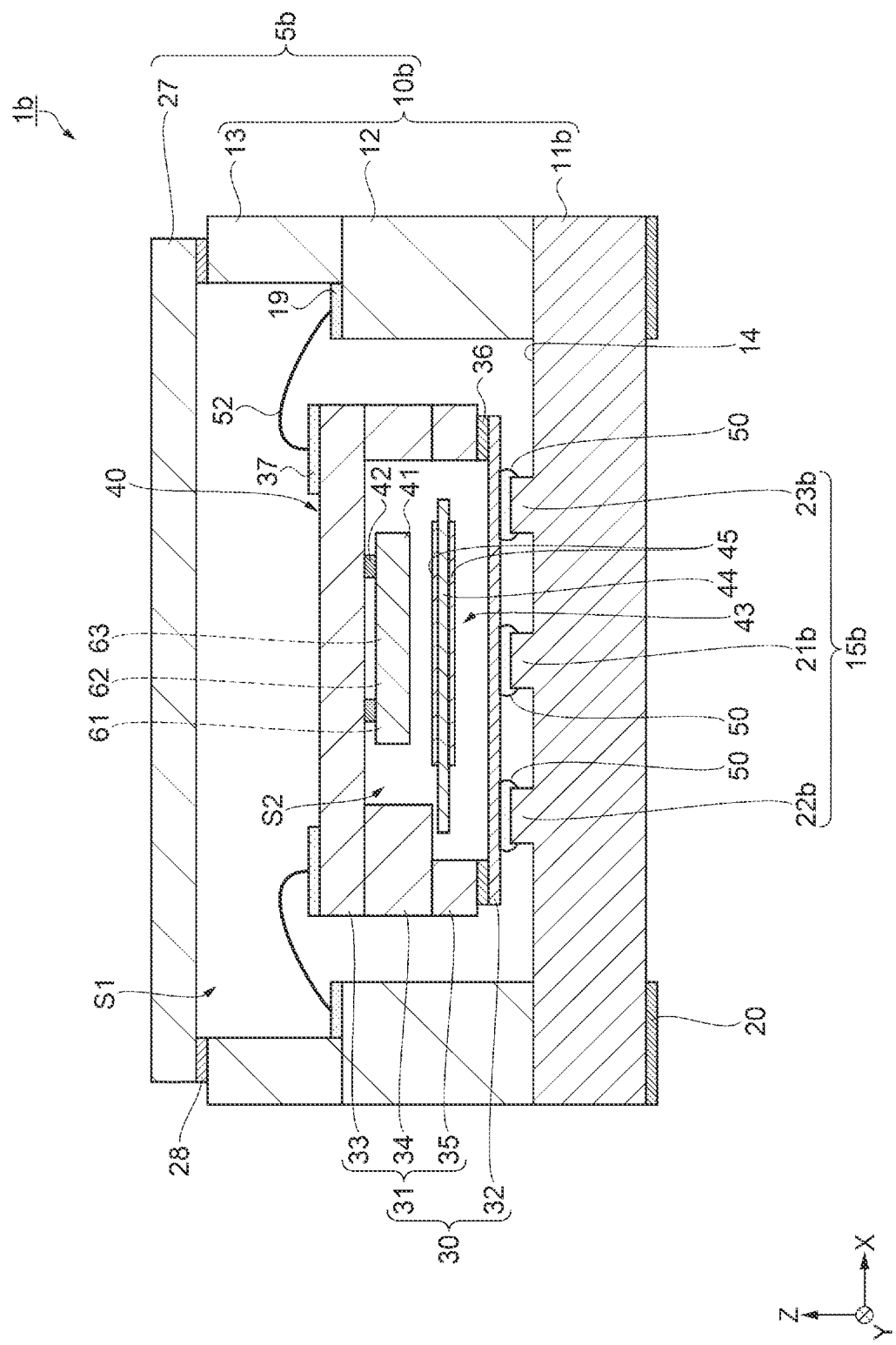
FIG. 7 is a cross-sectional view taken along a line D-D in FIG. 6.

In the oscillator 1b, as shown in FIGS. 6 and 7, five protruding portions 15b are provided at the upper surface 14 of a base substrate 11b, and the second container 30 is fixed to the protruding portions 15b via the bonding members 50. The protruding portions 15b are formed of the same material as that of the base substrate 11b made of ceramic. The protruding portions 15b may be formed integrally with the base substrate 11b, or may be fixed to the base substrate 11b via an insulating adhesive. A first protruding portion 21b is disposed substantially at a center of the base substrate 11b, a second protruding portion 22b and a third protruding portion 23b are disposed along the X direction with the first protruding portion 21b interposed therebetween, and a fourth protruding portion 24b and a fifth protruding portion 25b are disposed along the Y direction with the first protruding portion 21b interposed therebetween. Therefore, the second container 30 can be fixed substantially parallel to the base substrate 11b.

In the oscillator 1b according to the present embodiment, since the protruding portions 15b are formed of the same material as the base substrate 11b made of the ceramic, heat transfer between the second container 30 and the base substrate 11b can be reduced.

4. Fourth Embodiment

Figure 8:
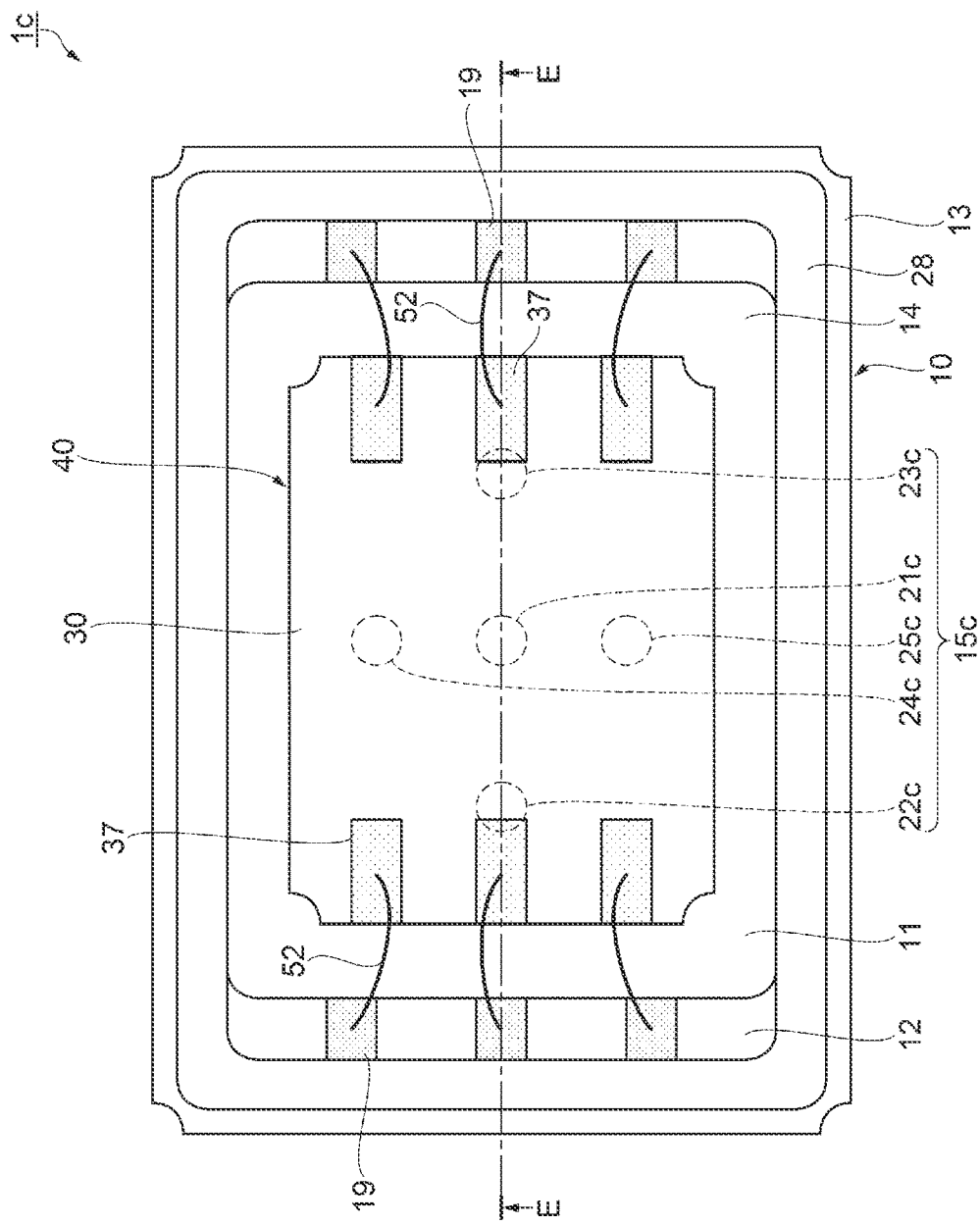
FIG. 8 is a plan view showing a schematic structure of an oscillator according to a fourth embodiment.

Next, an oscillator 1c according to a fourth embodiment will be described with reference to FIGS. 8 and 9. FIG. 8 shows a state in which the first lid 27 is removed for convenience of description.

The oscillator 1c of the present embodiment is similar to the oscillator 1 according to the first embodiment except that a structure of protruding portions 15c is different from a structure of the protruding portions 15 of the oscillator 1 according to the first embodiment. Differences from the first embodiment described above will be mainly described, and the description of the similar matters will be omitted.

Figure 9:
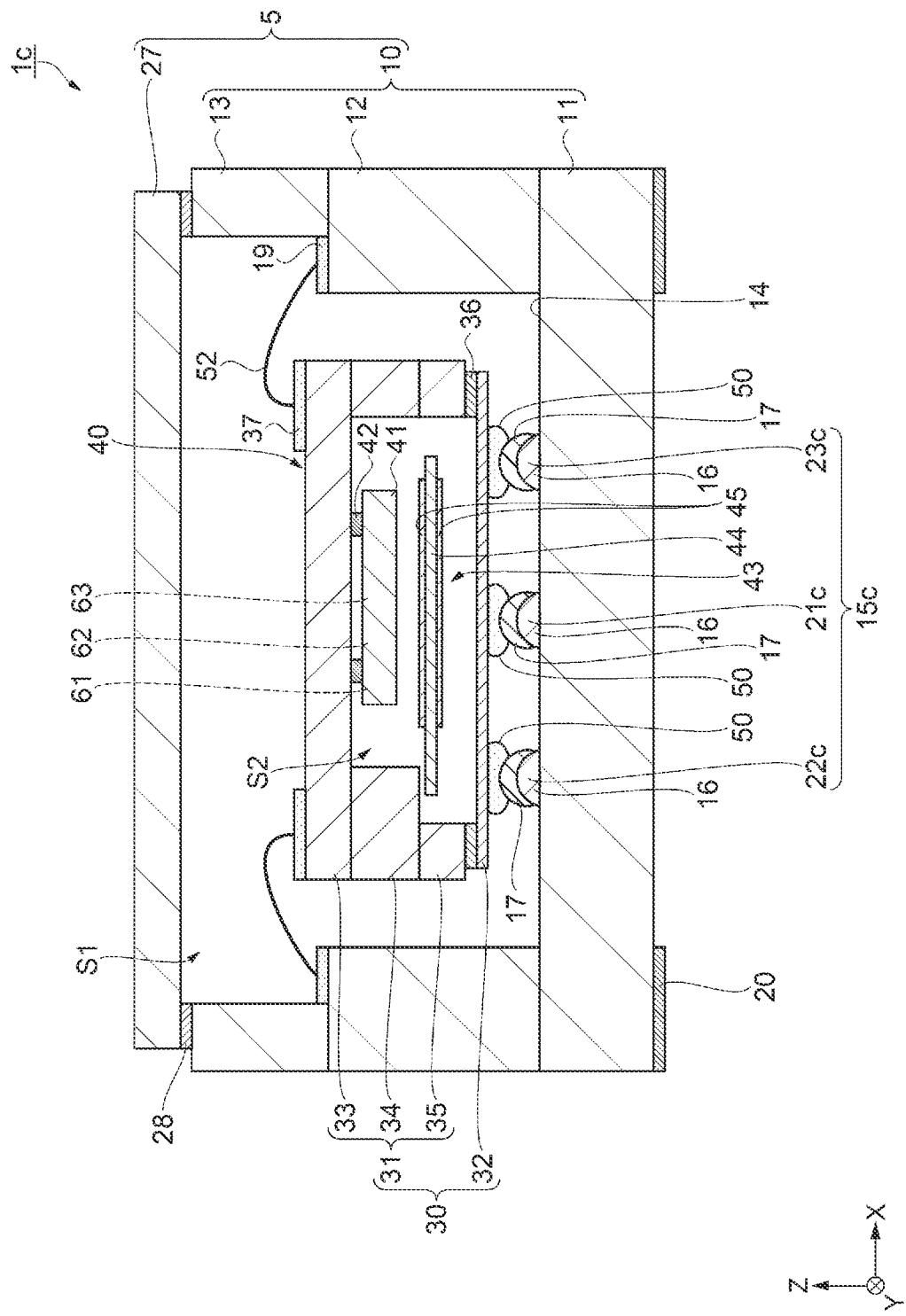
FIG. 9 is a cross-sectional view taken along a line E-E in FIG. 8.

In the oscillator 1c, as shown in FIGS. 8 and 9, five protruding portions 15c are provided at the upper surface 14 of the base substrate 11, and the second container 30 is fixed to the protruding portions 15c via the bonding members 50. Each of the protruding portions 15c includes a first bump member 16 and a second bump member 17, and the first bump member 16 and the second bump member 17 are stacked in this order from the base substrate 11 side. The first bump member 16 and the second bump member 17 are made of an insulating material such as an epoxy resin, a polyimide resin, and a silicon resin, and the first bump member 16 and the second bump member 17 may be made of the same material or different materials. A first protruding portion 21c is disposed substantially at a center of the base substrate 11, a second protruding portion 22c and a third protruding portion 23c are disposed along the X direction with the first protruding portion 21c interposed therebetween, and a fourth protruding portion 24c and a fifth protruding portion 25c are disposed along the Y direction with the first protruding portion 21c interposed therebetween. Therefore, the second container 30 can be fixed substantially parallel to the base substrate 11b.

The protruding portions 15c can be formed by applying the first bump members 16 in a hemispherical shape on the upper surface 14 of the base substrate 11 by a dispenser, curing the first bump members 16 by heating, applying the second bump members 17 on the first bump members 16 by the dispenser, and then curing the second bump members 17 by the heating. In the present embodiment, the protruding portion 15c is formed by stacking the two bump members, but the present disclosure is not limited thereto, and the protruding portion 15c may be formed by stacking three or more bump members.

In the oscillator 1c according to the present embodiment, since the protruding portions 15c for fixing the second container 30 have a two-stage configuration of the first bump members 16 and the second bump members 17, a path of heat conduction between the second container 30 and the base substrate 11 becomes longer, and heat is less likely to be conducted. Therefore, heat transfer between the second container 30 and the base substrate 11 can be further reduced.

5. Fifth Embodiment

Figure 10:
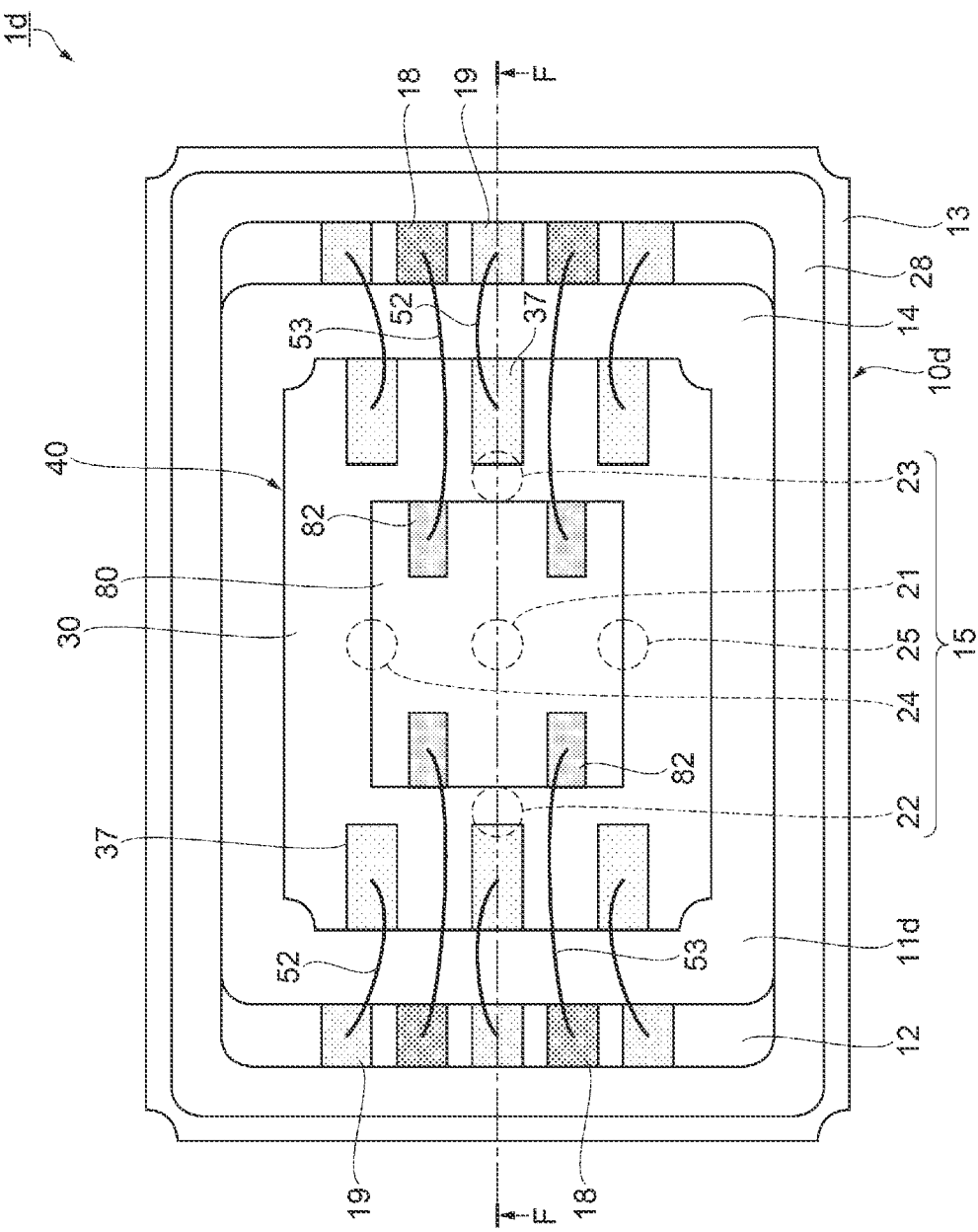
FIG. 10 is a plan view showing a schematic structure of an oscillator according to a fifth embodiment.

Next, an oscillator 1d according to a fifth embodiment will be described with reference to FIGS. 10 and 11. FIG. 10 shows a state in which the first lid 27 is removed for convenience of description.

The oscillator 1d according to the present embodiment is similar to the oscillator 1 according to the first embodiment except that a structure of a base substrate 11d is different from that of the oscillator 1 according to the first embodiment and a heater 80 and a heater control integrated circuit 84 are disposed. Differences from the first embodiment described above will be mainly described, and the description of the similar matters will be omitted.

Figure 11:
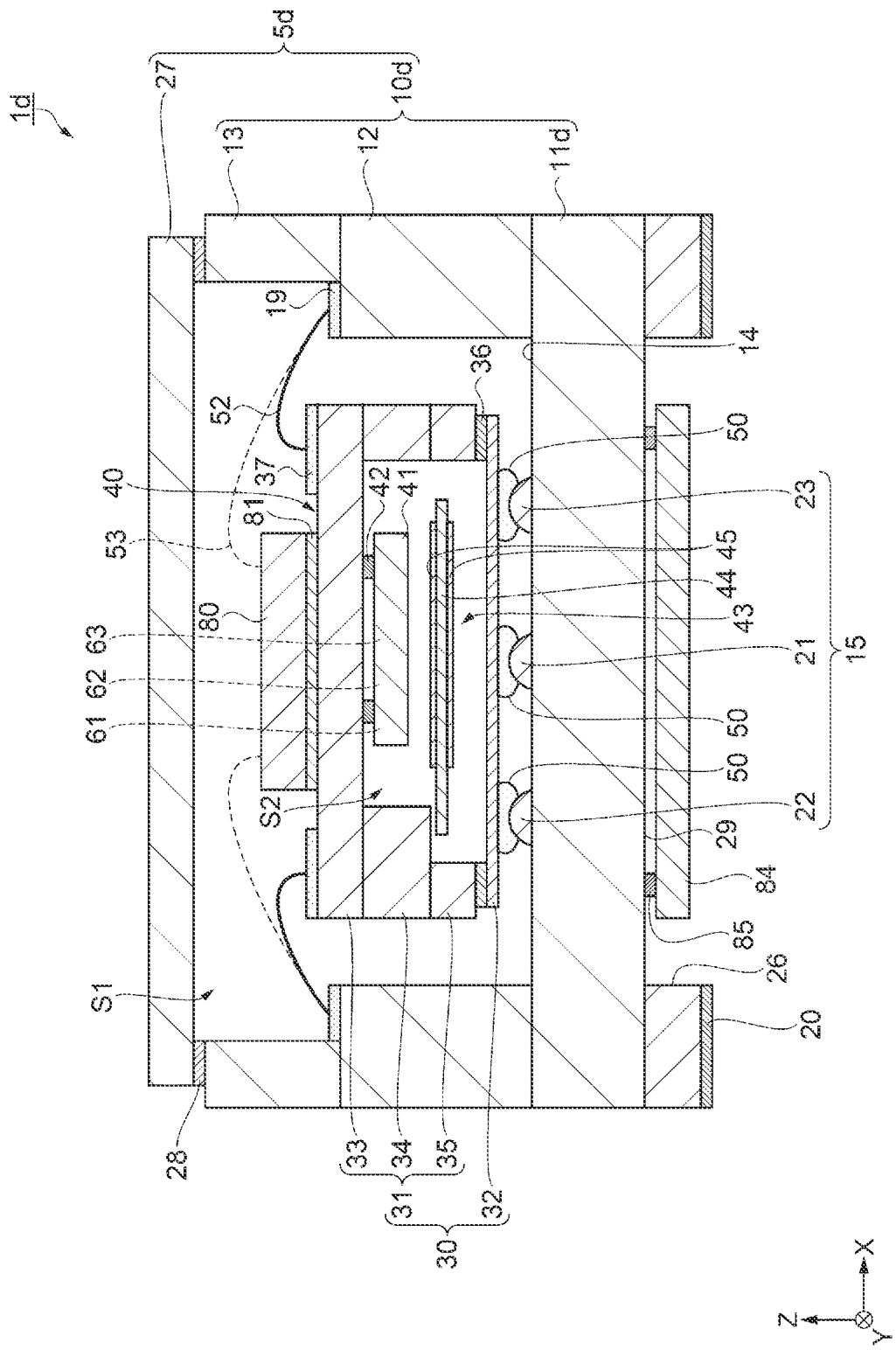
FIG. 11 is a cross-sectional view taken along a line F-F in FIG. 10.

As shown in FIGS. 10 and 11, in the oscillator 1d, the heater 80 is fixed, via a bonding member 81 such as a conductive adhesive having high thermal conductivity, to a surface of the temperature compensated oscillator 40 on which the terminals 37 of the second container 30 are disposed. Terminals 82 provided at the heater 80 and internal terminals 18 provided at a first base 10d are electrically coupled to each other via bonding wires 53.

The base substrate 11d of a first container 5d has a recessed portion 26 recessed toward an upper surface 14 side. The heater control integrated circuit 84 for controlling the heater 80 is fixed to an inner bottom surface 29 of the recessed portion 26 via conductive bonding members 85 such as a metal bump and solder. Further, the heater control integrated circuit 84 is electrically coupled to the internal terminals 18 provided at the first base 10d via a wiring (not shown) and a through electrode (not shown) which are provided at the inner bottom surface 29 of the recessed portion 26. Therefore, by controlling the heater 80 to a constant temperature by the heater control integrated circuit 84, the temperature compensated oscillator 40 can be maintained at a constant temperature, and the frequency stability of an output oscillation frequency can be further improved.

In the oscillator 1d of the present embodiment, since the second container 30 to which the heater 80 is fixed is fixed to the base substrate 11d by the protruding portions 15 having an area smaller than an area of the second container 30, heat transfer between the second container 30 and the base substrate 11d can be reduced. In particular, since heat radiation from the second container 30 heated by the heater 80 can be reduced, power consumption of the heater 80 can be reduced.

What is claimed is:

1. An oscillator comprising:
   a container in which a vibrator is accommodated;
   a base substrate on which the container is mounted;
   three or more protruding portions provided on the base substrate at positions overlapping the container in a plan view and directly under the contain in a cross-sectional view; and
   a bonding member configured to bond the container and at least one of the three or more protruding portions.

2. The oscillator according to claim 1, wherein
   the container includes a base and a lid, and
   the lid is bonded to at least one of the three or more protruding portions, and the base is electrically coupled to the base substrate via a bonding wire.

3. The oscillator according to claim 2, further comprising:
   a sealing member bonding the base and the lid, wherein
   at least one of the three or more protruding portions bonded to the lid is provided at a position not overlapping the sealing member in the plan view.

4. The oscillator according to claim 1, wherein
   at least one of the three or more protruding portions is formed by an insulating bump member.

5. The oscillator according to claim 1, wherein
   at least one of the three or more protruding portions is formed of the same material as that of the base substrate.

6. The oscillator according to claim 1, wherein
   each of the three or more protruding portions is bonded to the container via the bonding member.

7. The oscillator according to claim 1, wherein
   at least one of the three or more protruding portions includes
   a first protruding portion bonded to the container via the bonding member; and
   a second protruding portion and a third protruding portion provided on an outer peripheral side of the container with respect to the first protruding portion, and gaps are provided between the second protruding portion and the container and between the third protruding portion and the container.

8. The oscillator according to claim 1, further comprising:
an integrated circuit including a temperature sensor and an oscillation circuit and accommodated in the container.

9. The oscillator according to claim 1, further comprising:
a heater fixed to the container.

10. An oscillator comprising:
a container in which a vibrator is accommodated;
a base substrate on which the container is mounted;
three or more protruding portions provided on the base substrate at positions overlapping the container in a plan view and directly under the container in a cross-sectional view, wherein at least one of the three or more protruding portions includes
   a first protruding portion, a second protruding portion, and a third protruding portion provided on an outer peripheral side of the container with respect to the first protruding portion, and
   gaps are provided between the second protruding portion and the container and between the third protruding portion and the container; and
a bonding member configured to bond the container and at least one of the three or more protruding portions, wherein the first protruding portion is bonded to the container via the bonding member.

* * * * *